United States Patent
Paiz Gatica et al.

(10) Patent No.: US 10,627,434 B2
(45) Date of Patent: Apr. 21, 2020

(54) ELECTRICAL ASSEMBLY AND MEASUREMENT CIRCUIT AND METHOD FOR MONITORING A COMPONENT THEREOF

(71) Applicant: Weidmüller Interface GmbH & Co. KG, Detmold (DE)

(72) Inventors: Carlos Paiz Gatica, Detmold (DE); Rico Schindler, Vlotho (DE)

(73) Assignee: Weidmüller interface GmbH & Co. KG (DE)

( * ) Notice: Subject to any disclaimer, the term of this patent is extended or adjusted under 35 U.S.C. 154(b) by 127 days.

(21) Appl. No.: 15/561,651

(22) PCT Filed: Apr. 8, 2016

(86) PCT No.: PCT/EP2016/057823
§ 371 (c)(1),
(2) Date: Sep. 26, 2017

(87) PCT Pub. No.: WO2016/162517
PCT Pub. Date: Oct. 13, 2016

(65) Prior Publication Data
US 2018/0074100 A1   Mar. 15, 2018

(30) Foreign Application Priority Data

Apr. 9, 2015 (DE) .......... 10 2015 105 354
Jun. 11, 2015 (DE) .......... 10 2015 109 285

(51) Int. Cl.
*G01R 27/08* (2006.01)
*G01R 31/42* (2006.01)
(Continued)

(52) U.S. Cl.
CPC .......... *G01R 27/08* (2013.01); *G01R 31/14* (2013.01); *G01R 31/42* (2013.01); *H02M 1/096* (2013.01); *H02M 3/33507* (2013.01)

(58) Field of Classification Search
CPC ........ G01R 27/08; G01R 31/14; G01R 31/42; H02M 1/096; H02M 3/33507
(Continued)

(56) References Cited

U.S. PATENT DOCUMENTS 5,497,095 A * 3/1996 Ueyama ............ G01R 27/2605
                                                 324/522
5,694,051 A * 12/1997 Ueyama ............ G01R 27/2605
                                                 324/537
(Continued)

FOREIGN PATENT DOCUMENTS

DE       2710712 A1    9/1978
DE    102012112901 A1 * 6/2014 .......... G01R 31/028
(Continued)

OTHER PUBLICATIONS

Maxim Integrated, Integrated Voltage Limiters for Automotive Applications, www.maximintegrated.com/en/app-notes/index.mvp/id/3895, Aug. 2014. (Year: 2014).*
(Continued)

*Primary Examiner* — Patrick Assouad
*Assistant Examiner* — Sean Curtis
(74) *Attorney, Agent, or Firm* — Laubscher & Laubscher, P.C.

(57) ABSTRACT

A measuring method is provided for monitoring a component of an electrical assembly, in which the voltage across at least one component of the electrical assembly and a current through the component are measured, and in which, from measurement values for the voltage and the current, a resistance value of the component is determined. The volt-
(Continued)

age and the current are measured in successive switching periods of a periodic switching signal of the electrical assembly, and the resistance value is determined based on the measurement values for voltage and current from the successive switching periods. A measuring circuit for monitoring a component of an electrical assembly is provided with an analog/digital converter. An electrical assembly, in particular a switching power supply, having such a measuring circuit is also provided.

5 Claims, 3 Drawing Sheets

(51) Int. Cl.
  *G01R 31/14* (2006.01)
  *H02M 1/096* (2006.01)
  *H02M 3/335* (2006.01)
(58) Field of Classification Search
  USPC .......................................................... 324/421
  See application file for complete search history.

(56) References Cited

U.S. PATENT DOCUMENTS

| | | | | |
|---|---|---|---|---|
| 5,798,648 | A * | 8/1998 | Ueyama | G01R 27/2605 324/548 |
| 6,362,627 | B1 * | 3/2002 | Shimamoto | G01R 19/25 324/434 |
| 6,480,400 | B2 * | 11/2002 | Wu | G06F 1/26 363/21.01 |
| 6,885,568 | B2 * | 4/2005 | Kernahan | H02M 3/157 363/132 |
| 7,148,697 | B2 * | 12/2006 | Doljack | G01R 27/2605 324/548 |
| 7,618,854 | B2 * | 11/2009 | Lee | H01L 21/823807 438/197 |
| 7,869,235 | B2 * | 1/2011 | Lin | H02M 1/34 363/21.18 |
| 7,893,662 | B2 * | 2/2011 | Ribellino | H02M 3/07 307/109 |
| 8,098,696 | B2 * | 1/2012 | Bronczyk | G01R 31/025 370/537 |
| 8,619,445 | B1 * | 12/2013 | Low | H02M 1/32 363/59 |
| 8,912,990 | B2 * | 12/2014 | Vieri | G09G 3/3648 345/100 |
| 9,306,543 | B2 * | 4/2016 | McQuirk | H03K 5/00006 |
| 9,362,894 | B1 * | 6/2016 | Omer | H03K 5/24 |
| 9,379,621 | B1 * | 6/2016 | Kalyanaranman | H02M 3/33507 |
| 9,389,263 | B2 * | 7/2016 | Sartler | G01R 31/028 |
| 9,484,822 | B2 * | 11/2016 | Djenguerian | H02M 3/33507 |
| 9,490,690 | B2 * | 11/2016 | Bhandarkar | H02M 7/219 |
| 9,778,290 | B2 * | 10/2017 | Moon | G01R 19/0092 |
| 9,813,063 | B2 * | 11/2017 | Stirk | H02J 7/0052 |
| 10,079,544 | B2 * | 9/2018 | Djenguerian | H02M 3/33507 |
| 2004/0167733 | A1 | 8/2004 | MacDonald | |
| 2009/0319209 | A1 * | 12/2009 | Lim | G01R 31/3648 702/63 |
| 2015/0355259 | A1 * | 12/2015 | Sartler | G01R 31/028 324/548 |
| 2016/0178705 | A1 * | 6/2016 | Stirk | H02J 7/0052 324/431 |
| 2017/0184638 | A1 * | 6/2017 | Moon | G01R 19/0092 |
| 2017/0302164 | A1 * | 10/2017 | van Roosmalen | H02J 7/0052 |
| 2018/0074100 | A1 * | 3/2018 | Paiz Gatica | G01R 31/42 |
| 2018/0348270 | A1 * | 12/2018 | Karlsson | H02M 1/14 |
| 2019/0068063 | A1 * | 2/2019 | Balakrishnan | H02M 1/08 |

FOREIGN PATENT DOCUMENTS

| | | | |
|---|---|---|---|
| DE | 102012112901 A1 | 6/2014 | |
| EP | 0652445 A1 | 5/1995 | |
| EP | 0652445 A2 * | 5/1995 | ............ G01R 31/42 |
| WO | WO-2014095479 A1 * | 6/2014 | ............ G01R 31/028 |

OTHER PUBLICATIONS

Hempfling, Ruediger; Technische Hochschule Mittelhessen, Fachbereich IEM: Ergänzungsblätter zur Vorlesung: Elektrische Messtechnik 1. 2006. URL: http://alpha.fhfriedberg. de/iem/uploads/media/Ergb_MT1_01.pdf [abgerufen am Jan. 25, 2016].

* cited by examiner

ELECTRICAL ASSEMBLY AND MEASUREMENT CIRCUIT AND METHOD FOR MONITORING A COMPONENT THEREOF

This application is a § 371 National Stage Entry of PCT/EP2016/057823 filed Apr. 8, 2016 entitled "Electrical Assembly and Measurement Circuit and Measuring Method for Monitoring a Component of the Electrical Assembly." PCT/EP2016/057823 claims priority of DE 102015105354.3 filed Apr. 9, 2015 and DE 102015109285.9 filed Jun. 11, 2015. The entire contents of these applications are incorporated herein by reference in their entireties.

BACKGROUND OF THE INVENTION

The invention relates to a measuring circuit and a measuring method for monitoring a component of an electrical assembly, as well as an electrical assembly, in particular a switching power supply, having such a measuring circuit to execute the measuring method.

In switching power supplies, capacitors are used on both the primary and secondary sides to smooth and stabilize voltages, in particular rectified AC voltages. Usually, electrolytic capacitors are used for this purpose, since these include high capacities and low component weights, and since they are relatively low-cost. The capacity of capacitors, in particular of such electrolytic capacitors, decreases as the number of operating hours increases. This usually goes along with an increase of their inner resistance, also referred to as equivalent series resistance (ESR).

Frequently, these smoothing and stabilizing capacitors are the cause for failure of a switching power supply. They significantly compromise and limit the lifespan of the switching power supply. The aging process of the capacitors generally is not linear. Usually, an initially low, relative reduction in capacity or low, relative increase in the equivalent series resistance increases over time. Once the capacity falls below, or the equivalent series resistance rises above, a certain threshold, the switching power supply is no longer operable or can only operate at low loads. Detecting an imminent failure of the switching power supply before the switching power supply actually fails requires being able to determine either the reduction in capacity or the increase in equivalent series resistance with sufficient accuracy, such that even small deviations from the baseline can be detected.

Aside from the capacitors, the semiconductor switches of the switching power supply, in particular the clocked semiconductor switch used on the primary side of the switching converter, represent a frequent cause for the failure of a switching power supply. Typically, field-effect transistors are used as clocked semiconductor switches, in particular metal oxide semiconductor field-effect transistors (MOSFETs).

Due to carrier diffusion processes and/or boundary condition changes caused by consistently high temperatures, the effective resistance of the field-effect transistor in its conductive state changes over time. An increase of this effective resistance in the conductive state leads to higher power losses in the transistor, which leads to further temperature increases, which in turn accelerates the aging process even further. For this reason, the aging process in field-effect transistors, similar to that in capacitors, is not linear, but self-accelerating. Correspondingly, early detection of changes in the effective resistance of a field-effect transistor in its conductive state is also desirable, in order to be able to predict imminent failure in due time, before failure actually occurs.

Both the determination of the effective resistance of a semiconductor switch or equivalent series resistance of a capacitor and the determination of the capacity of the capacitor are based on a measurement of current and voltage. In the determination of capacity, the current flowing in a capacitor is linked to the change in voltage across the capacitor via the capacity of the capacitor. In the determination of the equivalent series resistance of the capacitor or of the effective resistance of the semiconductor switch, respectively, the resistance is the quotient of the applied voltage and the flowing current.

The previously described determinations of equivalent series resistance, effective resistance, or capacity therefore require a measurement of voltage and current for each component to be monitored. Switching power supplies are operated at clock frequencies in the range of tens of kHz (kilo-Hertz), up to 100 kHz. Changes in this clock frequency cause changes in the voltages and currents in the components to be monitored. As these measured values change periodically with the clock frequency of the switching power supply, the method according to the state of the art is to simultaneously measure the voltage and current values to be used in the calculations. This requires one measuring device per component, for example, one A/D (analog/digital) converter for the voltage and another one for the value of the current. A/D converters, with suitable specifications regarding their speeds, are cost-intensive components. For example, monitoring the primary-side capacitor, the primary-side semiconductor switch and two secondary-side capacitors in a switching power supply would require two such A/D converters per respective component, for a total requirement of eight such converters.

SUMMARY OF THE INVENTION

One object of the present invention is to provide a measurement circuit and a measurement method for monitoring components of an electrical assembly, where monitoring of the aging status can be executed using voltage and current measurements with the lowest-possible component count which results in a lower cost. Another object is to provide an electrical assembly containing such a measurement circuit.

A measurement circuit of the aforementioned type includes an analog/digital converter, which is connected to the electrical assembly via a multiplexer in order to either measure the voltage across at least one component or to measure the current through the component. The multiplexer enables a single analog/digital converter, one of the most expensive components of the measurement circuit, to determine both required measurement values: voltage and current. This is particularly advantageous when the measurement circuit is used in a switching power supply that includes a clock frequency of tens of kHz (kilo-Hertz), up to 100 kHz, as the analog/digital converter must be designed for short measurement periods in such a case, which requires expensive technology.

In a preferred embodiment, the measurement circuit includes a voltage-limiting circuit positioned at the input side of the multiplexer, which limits the input voltage to a maximum value. This embodiment provides the measurement of the effective resistance of a primary semiconductor switch in a switching power supply. Depending on the level of the line voltage, up to several hundred volts could be present across the semiconductor switch when the semiconductor switch is in its closed state. However, when the semiconductor switch is in its conductive state, the voltage drop across the switch measures from only a few millivolts up to about 100 millivolts. The voltage-limiting circuit prevents downstream components of the measurement circuit from being destroyed or saturated by excessive voltages.

In another embodiment, the measurement circuit includes a synchronization device, which measures voltage and/or current synchronized to a periodic switching signal of the electronic assembly. The preferred embodiment of the measurement circuit is one that is equipped to measure voltage and current in successive switching periods of the periodic switching signal and to determine a resistance value on the basis of measurements of voltage and current, which were measured at comparable times within these successive switching periods. The values of the voltage and current generally are not constant during a switching period. Synchronization ensures that the measurements of voltage and current, which are taken in successive switching periods, are collected at identical times within the respective switching periods. This way the measurements are taken under identical conditions and can be combined to calculate a resistance value.

One electrical assembly according to the invention includes such a measurement circuit for measuring a resistance value of a component of the electrical assembly during the operation of the electrical assembly.

In one embodiment of the electrical assembly, the assembly is designed as a switching power supply with a switching converter, where the measurement circuit is set to measure a resistance of a switching transistor of the switching converter. It is preferred that the measurement circuit is designed to also measure the equivalent series resistance of a capacitor in a primary filter stage.

One measurement method for monitoring a component of an electrical assembly, where a voltage across at least one component of the electrical assembly and a current through the component are measured, and where a resistance value of the component is determined on the basis of the measured values of voltage and current, is characterized in that the voltage and the current are measured in successive switching periods of a periodic switching signal of the electrical assembly and that the resistance value is determined on the basis of the measurements of voltage and current from the successive switching periods.

In another embodiment of the measurement method, the measurement times for voltage and current are synchronized to the periodic switching signal of the electrical assembly, wherein the resistance value is determined on the basis of the measured values of voltage and current, which were measured at comparable times within successive switching periods. The measurements are thus taken under identical conditions and can be combined to calculate a resistance value. This is based on the finding that, while measured values may vary widely within a single switching period, these variations do not change from one switching period to the next, or only change very slowly compared to the duration of the switching period, e.g., during a change in the load on the switching power supply.

In a further embodiment of the measurement circuit, the electrical assembly is a switching power supply and the component is a switching transistor of a switching converter of the switching power supply.

BRIEF DESCRIPTION OF THE FIGURES

The invention will be explained in more detail below in connection with the accompanying drawing, in which.

DETAILED DESCRIPTION

Figure 1:
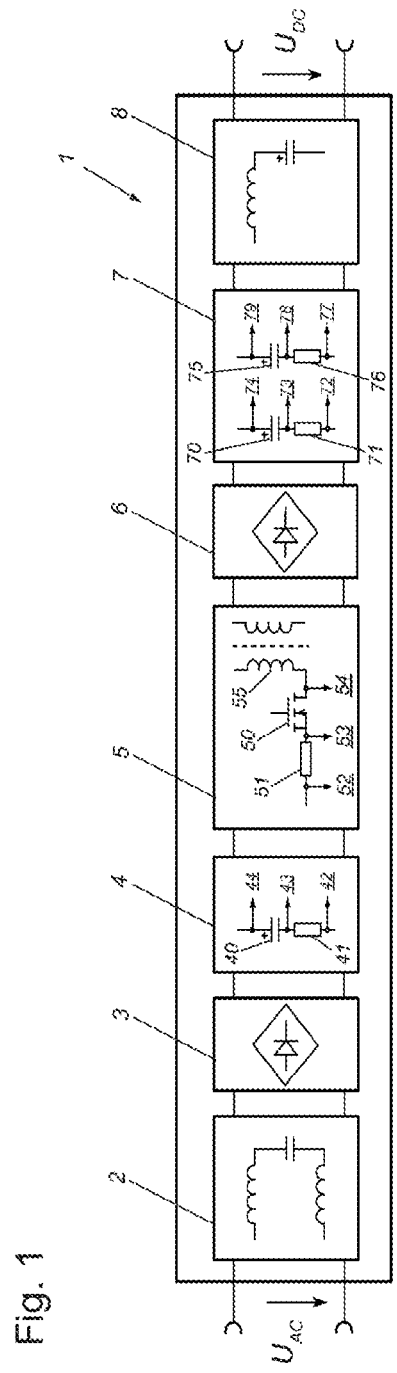
FIG. 1 is a schematic illustration of a switching power supply designed for use with a measurement circuit according to the invention.

FIG. 1 is a schematic illustration of a switching power supply 1 as an example of an electrical assembly, which is constructed for use with a measurement circuit. The switching power supply depicted in FIG. 1 includes a power factor correction filter (PFC) 2 on the input side which is to be connected to a line voltage $U_{AC}$ and which may be embodied as a passive filter for example. Depending on the power output of the switching power supply 1, an active power factor correction filter may also be used. The output of the power factor correction filter 2 is connected to a primary-side rectifier 3 such as a bridge rectifier, for example.

Connected in parallel to the output of the primary-side rectifier 3 is a primary filter stage 4 which includes a primary-side capacitor 40. Connected in series with the capacitor 40 is a shunt 41 which serves to measure the current flowing through the primary capacitor 40. Measurement locations or terminals 42-44 are provided on the primary-side capacitor 40 and shunt 41 for connection with a measurement circuit. The voltage present at the capacitor 40, also referred to as the capacitor voltage $U_{40}$, can be measured at the measurement terminals 43 and 44. The voltage drop across shunt 41 can be measured at measurement terminals 42 and 43, such that the current flowing through the primary-side capacitor 40, referred to as the capacitor current $I_{40}$, can be determined on the basis of this voltage and the known resistance value of the shunt 41.

Connected in parallel to the primary filter stage 4 is a switching converter 5. This converter includes a switching transistor 50, which switches the current through the primary coil of a transformer 55, clocked by a control device (not shown) of the switching power supply 1. In order to determine the current flowing through the switching transistor 50, this transistor is connected in series with a shunt 51. Similar to the measurement terminals 42-44, the series circuitry of switching transistor 50 and shunt 51 is equipped with measurement locations or terminals 52-54. They enable the measurement, in a manner comparable to that described above in relation to the primary filter stage 4, of the voltage across the switching path of the switching transistor 50 as well as of the current flowing through the switching transistor 50. The voltage and current at the switching transistor are referred to as the transistor voltage $U_{50}$ and transistor current $I_{50}$, respectively.

The transformer 55 is a galvanically isolating transformer. The primary and secondary sides of the switching power supply 1 are electrically isolated from each other. The secondary-side outputs of the transformer 55 are connected with a secondary filter stage 7 via a secondary rectifier 6, for example, a bridge rectifier or a simple rectifier of just one diode. In the embodiment shown, the secondary filter stage 7 includes two capacitors 70 and 75, which are connected in series with shunts 71 and 76, respectively, in order to measure the current through each of them. As with the primary filter stage 4, measurement locations or terminals 72-74 and 77-79 are provided which enable measurements of the voltage at the secondary capacitors 70 and 75, respectively, as well as of the currents flowing through both capacitors. Finally, a filter 8 is connected downstream of the secondary filter stage 7, at the output of which is present a DC voltage $U_{DC}$ provided by the switching power supply 1.

Figure 2:
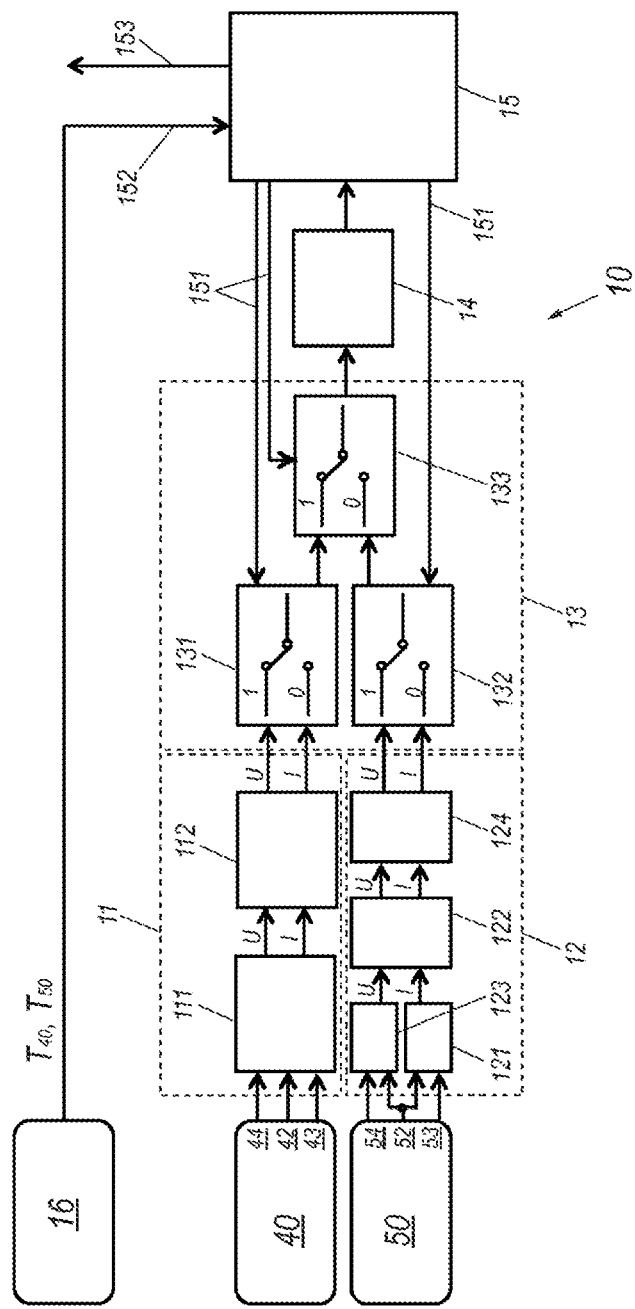
FIG. 2 is a block diagram of a measurement circuit according to the invention.

FIG. 2 is a block diagram of a primary-side measurement circuit 10. The measurement circuit includes two signal-processing paths 11 and 12, the inputs of which are connected to the measurement terminals 42-44 of the primary filter stage 4 and the measurement terminals 52-54 of the switching converter 5, respectively. The capacitor voltage $U_{40}$ and the capacitor current $I_{40}$ of the first signal-processing path 11 can be measured across the measurement terminals 42-44. Similarly, the capacitor voltage $U_{50}$ and the capacitor current $I_{50}$ of the second signal-processing path 12 can be measured across the measurement terminals 52-54.

An analog filter 111 is located within the first signal-processing path 11 to measure voltage and current. This filter is a band-pass filter tuned to the switching frequency of the switching power supply 1, such that it allows the various measurement signals in accordance with the switching frequency to pass. In an advantageous embodiment, the filter 111 includes a third-order Butterworth characteristic. It is designed as a broadband filter, such that it will let the signal pass despite component tolerances and potentially varying switching frequencies of the switching power supply 1. An amplifier 112 is connected to the filter 111 for signal amplification and, if necessary, zero-point correction.

An analog filter 121 is located within the second signal-processing path 12 to measure the current. The filter 121 is comparable to the filter 111 in the first signal-processing path 11. To measure the voltage, a voltage-limiting circuit 123 is provided instead of a filter, which will be explained in more detail in connection with FIG. 3. In turn, an amplifier 122 is connected to both the filter 121 and the voltage-limiting circuit 123. Additionally, there is the option of providing a synchronization switch 124 in the signal-processing path, which is clocked by the switching transistor 50 and which only lets the measurement signals pass in the switched-on phase of the switching transistor 50.

Figure 3:
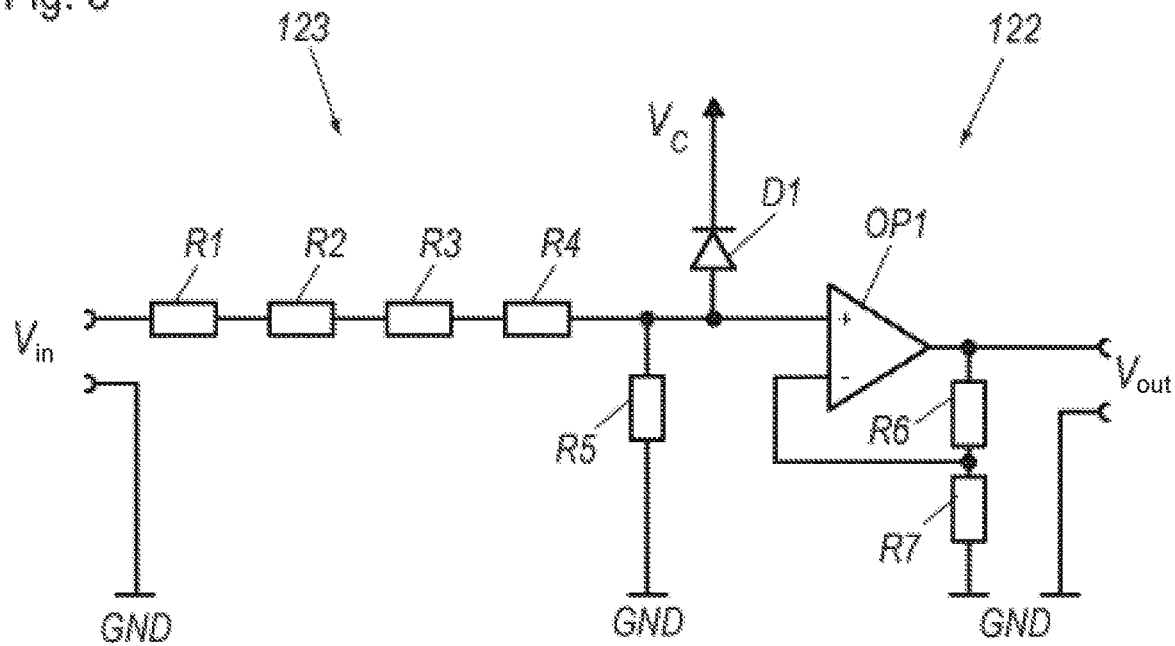
FIG. 3 is a detailed circuit diagram of a voltage-limiting circuit of the measurement circuit depicted in FIG. 2.

One embodiment of a voltage-limiting circuit 123 with an amplifier 122 connected to its output is shown in more detail in FIG. 3. Depending on the level of the line voltage $U_{AC}$, up to several hundred volts could be present across the switching transistor 50 when it is closed. But when the switching transistor 50 is open, the voltage drop across the transistor measures only a few millivolts, up to about 100 millivolts. The voltage-limiting circuit 123 prevents downstream components of the measurement circuit from being destroyed or saturated by excessive voltages.

The inputs of the voltage-limiting circuit 123 are fed with an input voltage $V_{in}$, which is to be measured, for example from the measurement terminals 53 and 54. Optionally, the voltage can also be measured at the measurement terminals 52 and 54, in which case the voltage drop across the shunt 51 which factors into that measurement, is later subtracted. The latter option is advantageous, because the measurement terminal 52 is then a common measurement terminal for voltage and current measurements.

The input voltage $V_{in}$ is first divided in a voltage divider using (high-resistance) resistors R1 to R5 by a certain factor, for example by the factor 5. The output of the voltage divider is connected via a diode D1 to a low positive potential $V_C$ of a few volts above the ground potential GND, and is therefore limited or pinned to this potential plus the forward-bias voltage of the diode D1. The voltage divider and the potential $V_C$ are selected such that the limitation for the high voltage is in effect when the switching transistor 50 is closed and such that the voltage is unaffected when the switching transistor 50 is open.

The output of the voltage divider is connected to the amplifier 122, which is formed by an operational amplifier OP1 and feedback resistors R6 and R7. The amplification factor of the amplifier 122 is selected such that the amplifier at least partially balances out the voltage division while at the same time preventing saturation at its input even at the pinned voltage.

This results in an output voltage $V_{out}$ at the output of the amplifier 122, which is held at a constant value of a few volts when the switching transistor 50 is closed, and which, when the switching transistor 50 is open, drops without significant delay to a value that is proportional to the voltage across the open switching transistor 50.

After signal processing of the measured values in the signal-processing paths 11 and 12, the processed measurement values are fed into a multiplexer 13. In the embodiment shown, the multiplexer 13 includes three cascaded switches: a first switch 131, a second switch 132 and a third switch 133. The positions of the first and second switches, 131 and 132, determine whether the measurement values for voltage and current are forwarded from signal-processing paths 11 or 12, respectively. The third switch 133 selects whether the measurement value of either voltage or current is forwarded from the first or second signal-processing path, 11 or 12. The switches 131, 132 and 133 are controlled by the micro-controller 15 via control lines 151. The output of the multiplexer 13 is connected to the input of an analog/digital (A/D) converter 14. The digital output of that converter in turn is read by the micro-controller 15.

The micro-controller 15 is connected via a signal input 152 to temperature sensors 16, which allow the micro-controller 15 to read a temperature $T_{40}$ of the primary capacitor 40 and a temperature $T_{50}$ of the switching transistor 50. The respective temperature sensors are in thermal contact with the respective components for this purpose.

The A/D converter 14 is a converter with a high sample rate, preferably of several megahertz (MHz). The sample rate in that scenario is multiple times higher than the typical switching frequency of the monitored switching converter, which lies in the range of tens of kHz, up to 100 kHz. The various input signals are applied to the A/D converter 14 via the multiplexer 13. Depending on the selected position of the switches 131-133, the micro-controller 15 assigns the data received from the A/D converter 14 to the various measurement values of voltage and current of the primary capacitor 40 or the switching transistor 50.

During the measurement process, the switches 131-133 of the multiplexer 13 are controlled in such a way that initially a series of data points for the voltage $U_{40}$ and subsequently, a series of data points for the current $I_{40}$, are collected at the primary capacitor 40, followed by a series of data points for the voltage $U_{50}$ and the current $I_{50}$, respectively, at the switching transistor 50. The measurement process according is synchronized to the switching clock rate of the switching transistor 50 of the switching converter 5.

Figure 4:
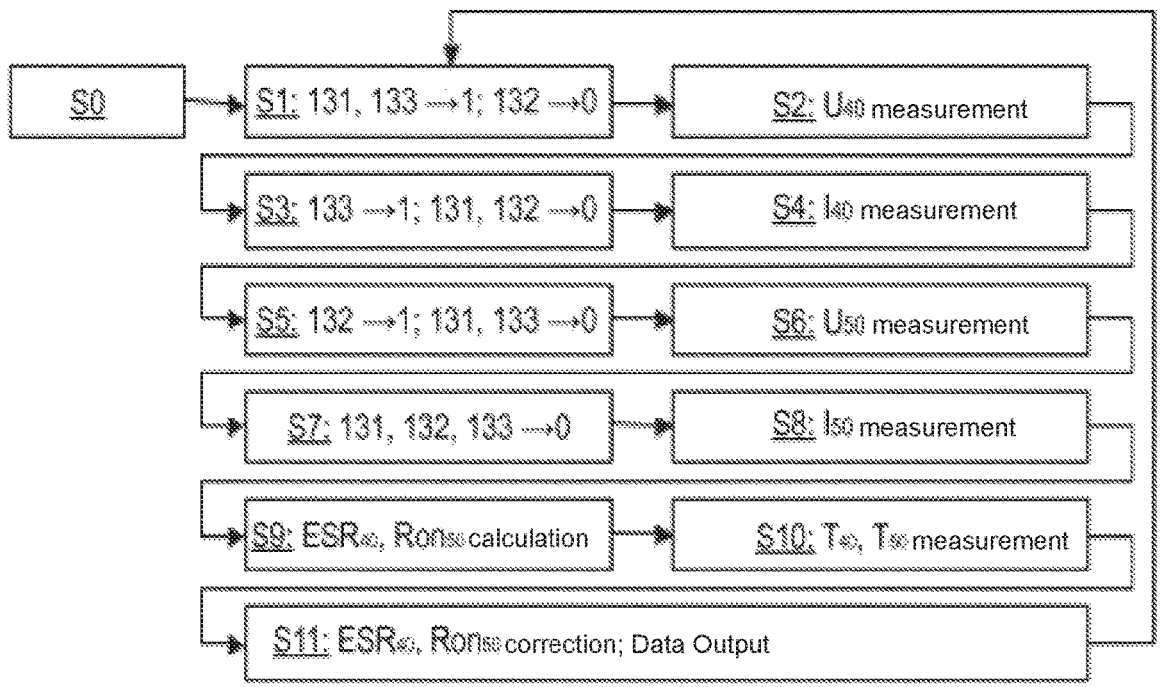
FIG. 4 is a flow diagram of a measurement method according to the invention.

This program sequence is depicted in a flow diagram in FIG. 4. Following initialization of the micro-controller 15 during a first step S0, the first switch 131 is set to the value 1 and the third switch 133 is set to the value 1 during the next step S1, such that the voltage measurement path of the first signal-processing path 11 is connected to the A/D converter 14.

Next, a number of data points to measure the capacitor voltage $U_{40}$ at the primary filter capacitor 40 are gathered in step S2—preferably synchronized with the switching clock rate of the switching transistor 50. These measurements extend over a specified number of switching periods of the switching converter 5. Synchronization can be performed via an interrupt signal to the micro-controller 15 using the control signal of the switching transistor 50. Alternatively, a specified number of data points can be collected, which then are limited to one or more periods on the basis of the recorded signal shape of the measurement series, using a respective algorithm in the micro-controller 15. This is possible because the measurement signal changes periodically with the switching period of the switching converter 5.

During a next step S3, the first switch 131 is set to a value 0, while the third switch 133 remains at the value 1, such that the voltage-measurement path of the first signal-processing path 11 is connected to the A/D converter 14. Following this, a number of data points to measure the current $I_{40}$ through the primary capacitor 40 are gathered and preferably synchronized with the switching clock rate of the switching transistor 50. This can be designed in such a way that these measurements extend over a specified number of switching periods of the switching converter 4.

Current and voltage at the capacitor in a first approximation change in the form of a sine curve. In order to determine an equivalent series resistance $ESR_{40}$ of the primary capacitor 40, the measurements are subsequently used at step S9 to calculate the effective value of the change in the voltage $U_{40}$ and the effective value of the current $I_{40}$ at the primary capacitor 40. Aside from the analog filtering that the voltage signal underwent in the filter 111, additional digital filtering of the signal is performed in the micro-controller 15. For digital signal filtering, the recorded signal sequences, which extend over one or more periods, are appended to one another several times and are fed into a digital filter. In this way, the signal is extended artificially, such that the digital filter can settle into an oscillation. An effective value for the change in voltage and the current at the capacitor 40 is then determined on the basis of the filtered signal. The digital filter may be designed as an adaptive filter, the parameters of which adjust to the measurement signals according to a specified algorithm. This makes it possible, for example, to perform narrow-band filtering even under varying switching frequencies of the switching converter 5.

In step S5, the third switch 133 is set to the value 0, such that now measurements are collected from the second signal-processing path 12. The second switch 132 is set to the value 1, such that the voltage-measurement path of the second signal-processing path 12 is connected to the A/D converter 14 to measure the voltage $U_{50}$ across the switching path of the switching transistor 50.

In the following step S6, measurement data are preferably collected during the switch-on period of the switching transistor, again synchronized with the switching times of the switching transistor 50. Synchronization can be performed using an interrupt signal to the micro-controller 15 or on the basis of the data shape. The latter option is easily implemented since the voltage across the switching transistor 50 varies greatly between its switch-off phase and its switch-on phase. Depending on the voltage-limitation circuit 123 according to FIG. 3, only data points collected in the switch-on phase are below the specified maximum measurement value and can therefore easily be identified.

Following voltage measurement in step S6, the second switch 132 is set to the value 0 during step S7, while the third switch 133 remains at the value 0 to subsequently record a measurement series of data points for the current $I_{50}$ through the switching transistor 50 in step S8. This in turn is synchronized with the switching clock rate of the switching transistor 50 and preferably in the switch-on phase of the next switching period of the switching transistor 50 immediately following the voltage measurement.

After the completion of the measurements, an analysis is performed in step S9 in which a value for the equivalent series resistance $ESR_{40}$ of the capacitor 40 is calculated based on the effective values of the change of the capacitor voltage $U_{40}$ and the capacitor current $I_{40}$. Furthermore, a value of the switch-on resistance $Ron_{50}$ of the switching transistor 50 is calculated based on the value pairs of voltage $U_{50}$ and current $I_{50}$, both of which were measured at identical times of successive switch-on phases.

During a next step S10, the temperatures $T_{40}$ and $T_{50}$ of the capacitor 40 and the switching transistor 50, respectively, are measured. As these values do not need to be collected at a specific time and not synchronized to a clock rate, an internal A/D converter inside the micro-controller 15 can be used for this purpose. The measured temperature values are used during a following step S11, in order to correct the measured resistance values ($ESR_{40}$, $Ron_{50}$) to a reference value at a specified temperature. Both of the aforementioned resistance values vary greatly depending on temperature. A statement about any possible fluctuations of the values, which might indicate an aging process, can only be made if the values are corrected for temperature effects. This can be done on the basis of tables or parameterized temperature curves, which are stored in the micro-controller 15.

Finally, the calculated and corrected values of $ESR_{40}$ and $Ron_{50}$ are output via the data output 153 in step S11, for example to a higher-level control unit of the switching power supply 1, in which these values are compared with the original values and which may issue an alert if the comparison leads to the conclusion that a failure may be imminent. Comparison and alert can also be performed by the micro-controller 15 itself.

A comparable measurement circuit, as depicted in FIG. 2, may also be positioned on the secondary side of the switching power supply of FIG. 1. In a secondary-side measurement circuit, two first signal-processing paths 11 are provided to collect the voltages $U_{70}$ and $U_{75}$, and currents $I_{70}$ and $I_{75}$, across or through the secondary-side capacitors 70 or 75, respectively. In a manner comparable to that described with respect to FIG. 4, the secondary measurement circuit determines a value of the equivalent series resistance $ESR_{70}$ or $ESR_{75}$ of both secondary-side filter capacitors 70 and 75, respectively. In this context, the micro-controllers of the primary-side and secondary-side measurement circuits may be connected with each other via a data channel, in order to collect and analyze the results in a micro-controller, if applicable.

The invention claimed is:

1. A measurement circuit for monitoring components of an electrical assembly, comprising an analog/digital converter, a multiplexer for connecting said analog/digital converter with the electrical assembly to selectively measure at least one of the voltage across and the current through at least one component, a voltage-limiting circuit connected upstream of said multiplexer to limit an input voltage to a maximum value, and a synchronization device connected between said voltage-limiting circuit and said multiplexer to measure at least one of the voltage and current synchronized with a periodic switching signal from the electrical assembly.

2. The measurement circuit as defined in claim 1, wherein the voltage and the current are measured in successive switching periods of the periodic switching signal to determine a resistance value on the basis of measured values of voltage and current measured at comparable times within successive switching periods.

3. An electrical assembly comprising a measurement circuit as defined in claim 1 for measuring a resistance value of a component of the electrical assembly during the operation of the electrical assembly.

4. The electrical assembly as defined in claim 3, and further comprising a switching power supply and a switching converter including a switching transistor, wherein the measurement circuit measures a resistance of the switching transistor.

5. The electrical assembly as defined in claim 4, and further comprising a primary filter stage connected between said switching power supply and said switching converter, said primary filter stage including a capacitor, and wherein said measurement circuit measures an equivalent series resistance of said capacitor.

* * * * *